(12) United States Patent
Lopez

(10) Patent No.: US 7,573,141 B2
(45) Date of Patent: Aug. 11, 2009

(54) SEMICONDUCTOR PACKAGE WITH A CHIP ON A SUPPORT PLATE

(75) Inventor: Jérôme Lopez, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 43 days.

(21) Appl. No.: 10/961,466

(22) Filed: Oct. 8, 2004

(65) Prior Publication Data
US 2005/0121759 A1   Jun. 9, 2005

(30) Foreign Application Priority Data
Oct. 21, 2003   (FR) .................................. 03 12307

(51) Int. Cl.
*H01L 23/48* (2006.01)
*H01L 23/52* (2006.01)
*H01L 29/40* (2006.01)

(52) U.S. Cl. .................. 257/783; 257/787; 257/E23.02
(58) Field of Classification Search ................. 257/783, 257/787, E23.02
See application file for complete search history.

(56) References Cited

U.S. PATENT DOCUMENTS

| | | | | |
|---|---|---|---|---|
| 5,285,352 A | * | 2/1994 | Pastore et al. ............... | 361/707 |
| 5,409,863 A | * | 4/1995 | Newman ..................... | 29/827 |
| 5,583,377 A | * | 12/1996 | Higgins, III ................. | 257/707 |
| 5,592,025 A | * | 1/1997 | Clark et al. .................. | 257/774 |
| 5,741,729 A | | 4/1998 | Selna | |
| 6,191,477 B1 | | 2/2001 | Hashemi | |
| 6,282,094 B1 | * | 8/2001 | Lo et al. ...................... | 361/704 |
| 6,521,990 B2 | | 2/2003 | Roh | |
| 6,605,353 B2 | * | 8/2003 | Okada et al. ................ | 428/413 |
| 6,861,750 B2 | * | 3/2005 | Zhao et al. .................. | 257/739 |
| 2002/0185722 A1 | | 12/2002 | Zhao | |

OTHER PUBLICATIONS

Preliminary French Search Report, FR 0312307, dated May 25, 2004.

* cited by examiner

*Primary Examiner*—David A Zarneke
*Assistant Examiner*—Jenny L Wagner
(74) *Attorney, Agent, or Firm*—Gardere Wynne Sewell LLP

(57) ABSTRACT

A semiconductor package includes a support plate made of an electrically non-conducting material. Electrical connection vias are formed outside a chip fixing region provided on the front face of the support plate. Electrical connection wires connect pads on a front of the chip to pads on the front of the support plate associated with the electrical connection vias. The front face of the support plate is further provided with at least one intermediate front layer made of a thermally conducting material extending at least partly below the chip. The rear face of the support plate is provided with at least one rear layer made of a thermally conducting material extending at least partly opposite the front layer. The front and rear layers are connected by vias made of a thermally conducting material that fills through-holes made through the plate.

14 Claims, 2 Drawing Sheets

SEMICONDUCTOR PACKAGE WITH A CHIP ON A SUPPORT PLATE

PRIORITY CLAIM

The present application claims priority from French Application for Patent No. 03 12307 filed Oct. 21, 2003, the disclosure of which is hereby incorporated by reference.

BACKGROUND OF THE INVENTION

1. Technical Field of the Invention

The present invention relates to the general field of semiconductor packages.

2. Description of Related Art

Known at the present time are semiconductor packages that comprise a support plate made of an electrically non-conducting material, a chip fixed by adhesive bonding at one point on a face of this support plate, electrical connection wires that connect pads on the chip to electrical connection vias that pass through the support plate, an encapsulation block of parallelepipedal shape that encapsulates the chip and the electrical wires, and electrical connection balls that are fixed to the vias on the opposite side of the chip.

Such packages have the drawback of confining the chips in materials that are very poor thermal conductors so that, if the chips generate heat, this heat is not easy to dissipate and impairs the electronic operation of the packages.

A need exists in the art for a semiconductor package whose structure allows the heat generated by the chip to be better dissipated.

SUMMARY OF THE INVENTION

The semiconductor package according to the invention comprises a support plate made of an electrically non-conducting material and provided with electrical connection through-means formed outside a fixing region provided on its front face, an integrated-circuit chip fixed to this fixing region, and electrical connection wires connecting pads on the front of the chip to pads on the front of the electrical connection means.

According to the invention, the front face of the plate is provided with at least one intermediate front layer made of a thermally conducting material extending at least partly below the chip, the rear face of the plate is provided with at least one rear layer made of a thermally conducting material extending at least partly opposite the front layer and in the front and rear layers are connected by vias made of a thermally conducting material that fills through-holes made through the plate.

According to the present invention, the package preferably includes balls made of a thermally conducting material fixed to the rear layer.

According to the present invention, the front layer preferably extends beyond the periphery of the chip and carries a projecting ring which surrounds the periphery of the chip at a certain distance therefrom and which stops the flow of an adhesive for fixing the latter.

According to the present invention, the front and rear layers are preferably made of an electrically conducting material, at least one front pad on the front layer being connected to at least one pad on the front of the chip by at least one electrical connection wire.

According to the present invention, the ring preferably extends between the periphery of the chip and the front pad on the front face.

According to the present invention, the electrical connection means preferably comprise vias made of an electrically conducting material filling through-holes made through the plate.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
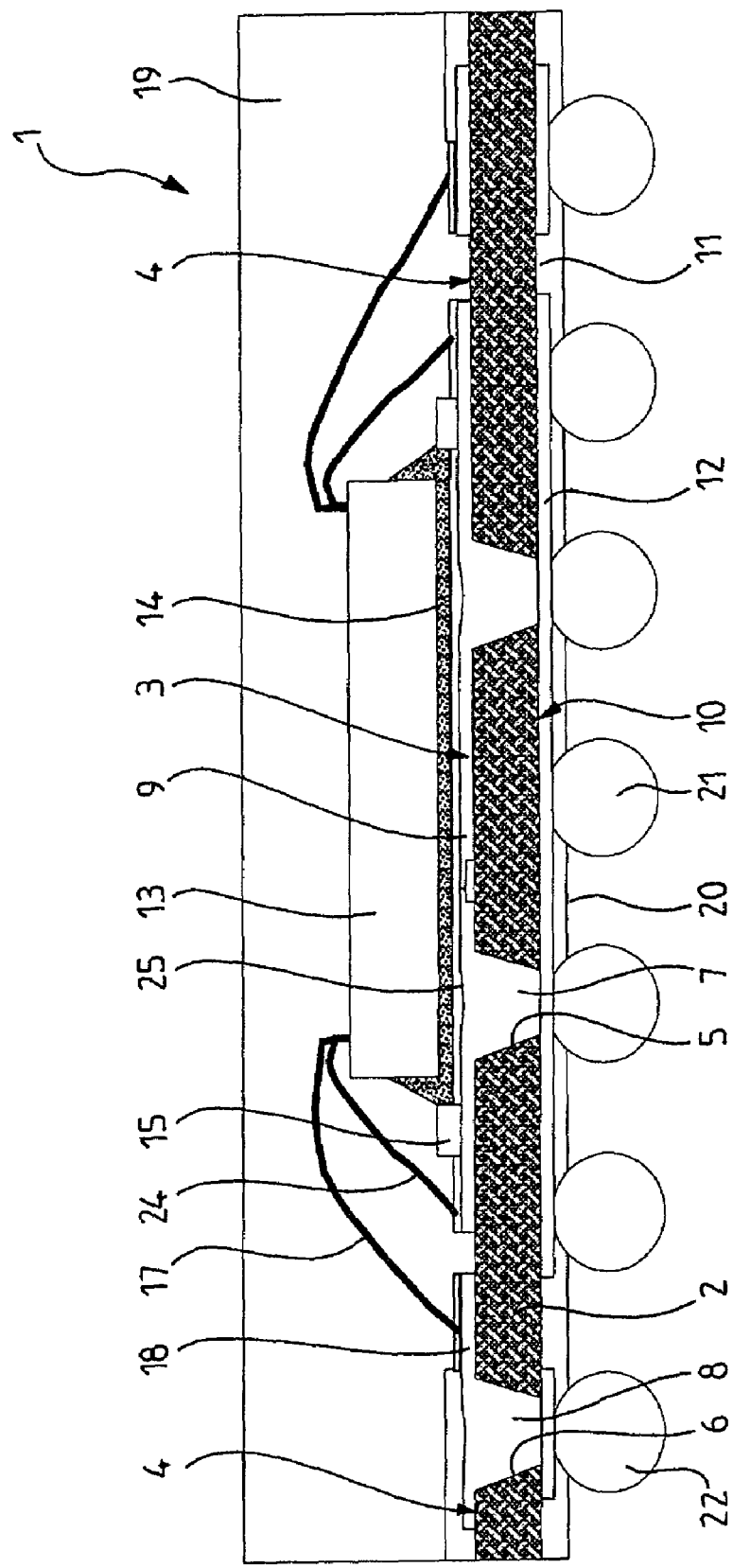
FIG. 1 shows a cross section of a semiconductor package according to the present invention.
Figure 2:
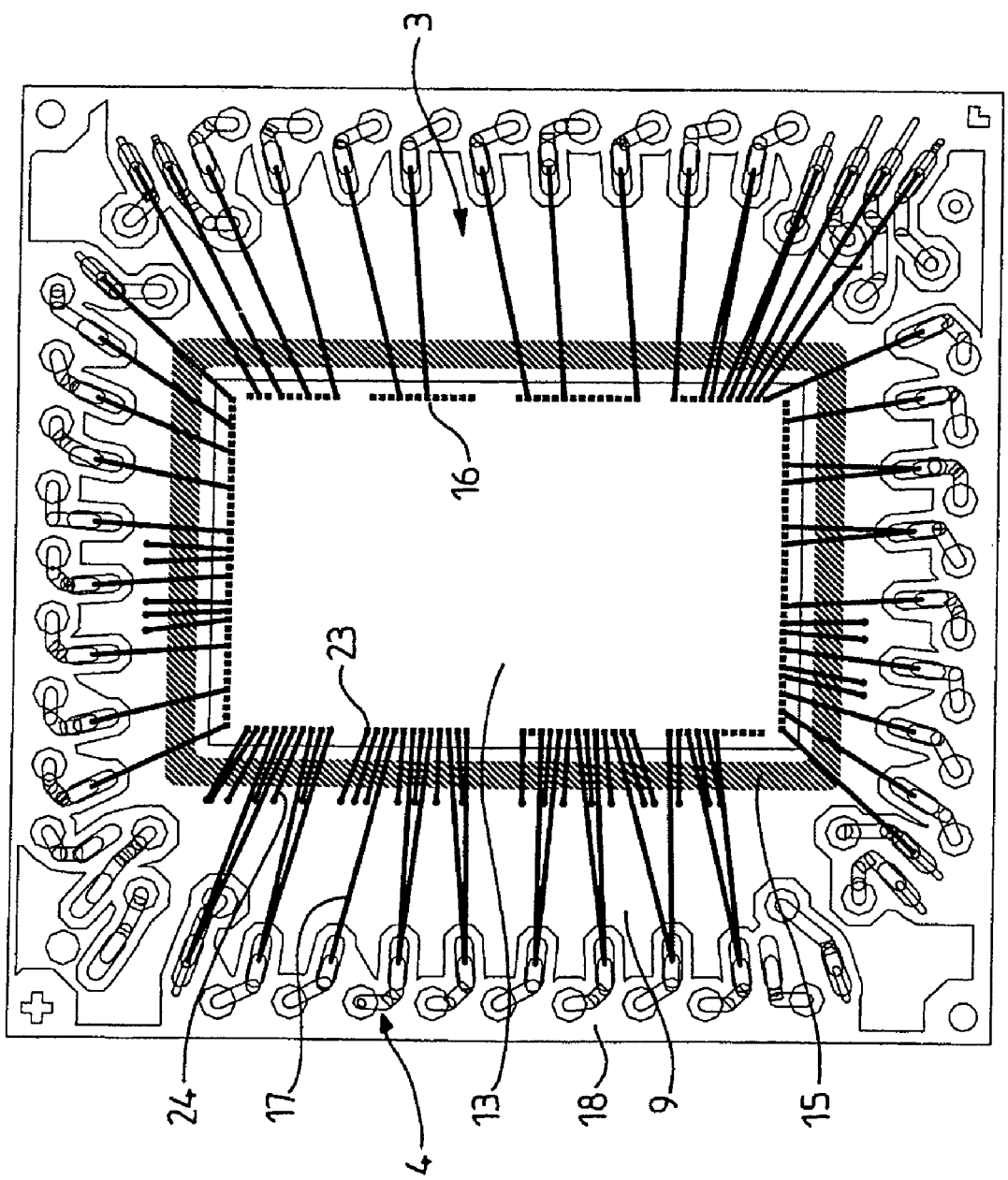
FIG. 2 shows a top view of the semiconductor package of FIG. 1.

The semiconductor package 1 shown in the figures, which is generally of parallelepipedal shape, comprises a support plate 2, which is square or rectangular, made of material that is electrically non-conducting and is a poor thermal conductor, the front face of which has a fixing region 3 surrounded by a connection region 4.

In its fixing region 3, the support plate 2 has a multiplicity of through-passages 5 distributed over the surface, which are completely filled by vias 7 made of at least one material that is thermally conducting and preferably electrically conducting.

In its connection region 4, the support plate 2 has a multiplicity of peripherally distributed through-passages 6, which are completely filled by vias 8 made of at least one electrically conducting and preferably good thermally conducting material.

The front face 4 of the support plate 2 is covered in its fixing region 3 by at least one front layer 9 made of a thermally conducting and preferably electrically conducting material.

A region 10 of the rear face 11 of the support plate 2, on the opposite side from the fixing region 9 and substantially corresponding, is also covered with at least one rear layer 12 made of a thermally conducting and preferably electrically conducting material.

Thus, the front layer 9 and the rear layer 12 are thermally coupled by the thermally conducting vias 7.

The rear face of an integrated-circuit chip 13 is fixed to the front face 9 by means of a layer of adhesive 14, the chip 13 being located approximately in the middle of the support plate 2 and the front layer 9 extending beyond the entire periphery of the chip 13.

The layer 9 has, at a certain distance from the periphery of the chip 13, a retaining ring 15 which constitutes a barrier for the layer of adhesive 14.

The front face of the chip 13 is provided with electrical connection pads 16 which are respectively connected by electrical connection wires 17 to localized layers 18 that cover the electrical connection pads 8, these being a certain distance from the layer 9.

The package 1 furthermore includes a parallelepipedal block of insulating encapsulation material, which extends in front of the support plate and encapsulates the chip 13 and the electrical connection wires 17.

A layer 20 of an organic finish material is deposited on the rear of the support plate 2, through which layer thermal connection and preferably electrical connection balls 21, respectively fixed to the rear face of the connection vias 7, and a multiplicity of balls 22 made of an electrically and preferably thermally conducting material, respectively fixed to the rear face of the connection vias 8, pass.

As a result of the foregoing, the heat produced by the chip 13 during its operation can be at least partially captured by the front layer 9 and transmitted to the rear layer 12 by means of vias 7, to be dissipated outside the package 1. The balls 21 may also contribute to this dissipation, directly or via a plate to which they could be connected. The balls 22 may also contribute to this dissipation.

Moreover, in the example shown, the front face of the chip 13 has electrical connection pads 23 that are connected by electrical connection wires 24 to the front layer 9, on that part of the latter which is external to the retaining ring 15, these wires 24 also being encapsulated in the block of encapsulation 19.

Thus, the pads 23 on the chip 13, which may be bulk pads, are electrically connected to the balls 21 for the purpose of external electrical connection.

The semiconductor package 1 can be fabricated in the following manner.

Starting with a support plate 2, a front layer and a rear layer, for example made of front copper, are deposited on its opposed faces provided by a front face with fixing region 3 and connection region 4 and rear face 11.

The holes 5 and 6 are drilled, for example by etching or by a laser, through the front copper layer deposited beforehand and into the support plate 2 until reaching the rear copper layer.

Deposited on the front face is a copper layer that covers the non-drilled parts of the previous layer and covers the walls of the holes 5 and 6 and the bottom of these holes on the rear layer deposited beforehand.

The holes 5 and 6 are filled from the front with copper or with another thermally and electrically conducting material.

The entire front face is again covered with a leveling copper layer.

The rear finish layer 20 made of an organic material is deposited.

In a variant, a front finish layer 25 made of an organic material is deposited.

The front layers are then cut between the fixing region 3 and the connection region 4.

Thus, the vias 7 and 8 of the layers 9 and 18 described above are obtained.

The stop ring 15 is produced.

The chip 13 is then fixed by means of the layer of adhesive 14, the flow of which before it cures is stopped by the projecting retaining ring 15.

The electrical connection wires 17 and 24 are then attached.

The encapsulation block 19 is produced in an injection mold.

The balls 21 and 22 are then mounted.

As is now standard practice, several packages may be fabricated on a single support plate and in a single encapsulation block, and then each individual package 1 can be obtained by sawing.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor package, comprising:
    a support plate made of an electrically non-conducting material and having electrical pads provided on a front face of the support plate outside of a chip fixing region, with electrical connection vias associated with the electrical pads;
    an electrically conductive front thermal layer on the front face of the support plate which covers the chip fixing region, the electrically conductive front thermal layer being made of a thermally conducting material and the electrical pads on the front face being positioned distant from a periphery of the electrically conductive front thermal layer;
    an electrically conductive rear thermal layer on a rear face of the support plate positioned opposite the electrically conductive front thermal layer, the electrically conductive rear thermal layer being and made of a thermally conducting material;
    electrically conductive thermal vias interconnecting the front and rear thermal layers through the support plate, the thermal vias being made of a thermally conducting material;
    an integrated-circuit chip having bonding pads and being attached by an adhesive to the electrically conductive front thermal layer at the chip fixing region, wherein the electrically conductive front thermal layer extends beyond a periphery of the chip;
    a retaining ring attached to the electrically conductive front thermal layer and positioned to surround the periphery of the chip at a certain distance therefrom leaving an encircling peripheral region of the electrically conductive front thermal layer to which the integrated circuit is attached outside of the retaining ring;
    a first bonding wire electrically connecting a first bonding pad of the integrated circuit chip to one of the electrical pads on the front face of the support plate;
    a second bonding wire electrically connecting a second bonding pad of the integrated circuit chip to the encircling peripheral region of the electrically conductive front thermal layer;
    wherein the adhesive used in attaching the integrated circuit chip which spreads out on the front face of the support plate is retained by the retaining ring from spreading to touch the first and second bonding wires.

2. The package of claim 1 further comprising at least one ball made of an electrically and thermally conductive material affixed to the electrically conductive rear thermal layer.

3. The package of claim 2 wherein the ball is also electrically conducting.

4. The package of claim 1 further comprising an organic front finish layer overlying the electrically conductive front thermal layer on the front surface.

5. The package of claim 1 further comprising an organic rear finish layer covering the electrically conductive rear thermal layer on the rear surface.

6. The package of claim 5 further comprising at least one ball made of an electrically and thermally conductive material affixed to the electrically conductive rear thermal layer and passing through the organic rear finish layer.

7. The package of claim 1 further comprising an encapsulant structure applied over the front surface of the support plate to encapsulate the chip fixing region and cover both the integrated-circuit chip and the retaining ring.

8. A semiconductor package, comprising:
an insulating support plate having electrical pads provided on a front face of the support plate outside of a chip fixing region, with electrical connection vias associated with the electrical pads;
an electrically and thermally conductive front layer on the front face of the support plate which covers the chip fixing region, wherein the electrical pads on the front face are positioned distant from a periphery of the electrically conductive front thermal layer;
an electrically and thermally conductive rear layer on a rear face of the support plate positioned opposite the electrically and thermally conductive front layer;
electrically and thermally conductive vias interconnecting the front and rear layers through the support plate;
an integrated-circuit chip having bonding pads and being attached by an adhesive to the front layer at the chip fixing region;
a retaining ring attached to the front layer and positioned to surround the periphery of the chip at a certain distance therefrom leaving an encircling peripheral region of the front layer to which the integrated circuit is attached located outside of the retaining ring;
a first bonding wire electrically connecting a first bonding pad of the integrated circuit chip to one of the electrical pads on the front face of the support plate;
a second bonding wire electrically connecting a second bonding pad of the integrated circuit chip to the encircling peripheral region of the front layer;
wherein the retaining ring retains the adhesive used in attaching the integrated circuit chip from spreading out on the front face of the support plate to contact the first and second bonding wires.

9. The package of claim 8 further comprising at least one ball made of an electrically and thermally conductive material affixed to the rear layer.

10. The package of claim 9 wherein the ball is also electrically conducting.

11. The package of claim 8 further comprising an organic front finish layer overlying the front layer on the front surface.

12. The package of claim 8 further comprising an organic rear finish layer covering the rear layer on the rear surface.

13. The package of claim 12 further comprising at least one ball made of an electrically and thermally conductive material affixed to the rear layer and passing through the organic rear finish layer.

14. The package of claim 8 further comprising an encapsulant structure applied over the front surface of the support plate to encapsulate the chip fixing region and cover both the integrated-circuit chip and the retaining ring.

* * * * *